US007164702B1

(12) United States Patent
Liu et al.

(10) Patent No.: US 7,164,702 B1
(45) Date of Patent: Jan. 16, 2007

(54) OPTICAL TRANSMITTERS AND INTERCONNECTS USING SURFACE-EMITTING LASERS AND MICRO-OPTICAL ELEMENTS

(75) Inventors: Jony Jiang Liu, Olney, MD (US); George J. Simonis, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 131 days.

(21) Appl. No.: 10/655,634

(22) Filed: Aug. 29, 2003

(51) Int. Cl.
*H01S 5/00* (2006.01)
(52) U.S. Cl. .................. 372/50.21; 372/50.23
(58) Field of Classification Search ............. 372/50, 372/50.1, 50.124, 50.21, 50.23
See application file for complete search history.

(56) References Cited

U.S. PATENT DOCUMENTS

| 5,073,041 | A | 12/1991 | Rastani | 385/33 |
| 5,461,637 | A | 10/1995 | Mooradian et al. | 372/92 |
| 5,500,540 | A | 3/1996 | Jewell et al. | 257/82 |
| 5,568,574 | A | 10/1996 | Tanguay, Jr. et al. | 385/14 |
| 6,122,109 | A | 9/2000 | Peake et al. | 359/620 |
| 6,122,417 | A | 9/2000 | Jayaraman et al. | 385/24 |
| 6,259,715 | B1 | 7/2001 | Nakayama | 372/50 |
| 6,365,237 | B1 | 4/2002 | Peake et al. | 427/585 |
| 6,404,947 | B1 | 6/2002 | Matsuda | 385/24 |
| 6,535,541 | B1 | 3/2003 | Boucart et al. | 372/96 |
| 6,556,349 | B1 | 4/2003 | Cox et al. | 359/626 |
| 6,583,445 | B1 | 6/2003 | Reedy et al. | 257/82 |
| 6,636,653 | B1 * | 10/2003 | Miracky et al. | 385/14 |
| 6,910,812 | B1 * | 6/2005 | Pommer et al. | 385/92 |
| 2003/0031218 | A1 | 2/2003 | Yeh | 372/45 |
| 2003/0072009 | A1 | 4/2003 | Domash et al. | 356/519 |
| 2004/0086011 | A1 * | 5/2004 | Bhandarkar | 372/43 |

OTHER PUBLICATIONS

E.M. Strzelecka, et al., Monolithic integration of vertical-cavity laser diodes with refractive GaAs microlenses, Electronic Letters Apr. 27, 1995 vol. 31, No. 9, pp. 724 and 725.
E.M. Strzelecka, et al. VCELbased modules for optical interconnects, Part of SPIE Conference on Vertical-Cavity Surface-Emitting Lasers III, San Jose California, Jan. 1999, SPIE vol. 3627 0277-786X/99, pp. 2-13.

* cited by examiner

*Primary Examiner*—James Menefee
(74) *Attorney, Agent, or Firm*—William V. Adams; William Randolph

(57) ABSTRACT

Micro-optical elements (MOEs) are designed and fabricated onto transparent laser driver substrates to collimate or focus the beams from vertical-cavity surface-emitting lasers (VCSELs) in accordance with specific application requirements. One disclosed example teaches the hybrid integration of a top-emitting 850 mm VCSEL array and a transparent sapphire substrate that supports a monolithic MOE with designated optical functionality. A flip-chipping hybridization technique ensures a realistic and reliable process. The VCSEL beams transmit directly through the MOE structure on the transparent sapphire substrate and become well-controlled optical outputs under precise specifications. The optical power loss in such a beam shaping process is minimized compared to configurations based on conventional optical components.

28 Claims, 3 Drawing Sheets

OPTICAL TRANSMITTERS AND INTERCONNECTS USING SURFACE-EMITTING LASERS AND MICRO-OPTICAL ELEMENTS

GOVERNMENT INTEREST

The invention described herein may be manufactured, used, and licensed by or for the United States Government.

FIELD OF THE INVENTION

This invention relates generally to vertical-cavity surface-emitting lasers (VCSELs) and, in particular, to devices and methods for integrating VCSELs and micro-optical elements (MOEs) to produce improved discrete and integrated structures.

BACKGROUND OF THE INVENTION

Vertical-cavity surface-emitting lasers (VCSELs) represent a new generation of high-speed, high-efficiency devices ideal for high-bandwidth optical sensors and data communication in military applications.

VCSEL technology offers many advantageous properties, such as micro-scaled device size, two-dimensional scalability, and lower power consumption. As an optical transmitter, a VCSEL emits a beam having a Gaussian profile with an extremely large beam divergence (half angle of more than 15 degrees). This property makes the direct integration of VCSELs to the receiving detectors or optical fibers very difficult since there is a large loss in device coupling. For instance, a single-mode fiber has a core diameter of only a few microns (μm) with a receiving half-angle of 5 degrees. Large multi-mode fibers require a receiving half-angle less than 10 degrees. For a two-dimensional system, a precise alignment that is necessary for the integration would become an even bigger challenge.

Presently, external optical components are used to control the laser beam in a VCSEL transmitter and interconnect system. However, it has been found that excessive optical parts could cause significant optical aberrations and insertion losses and increase substantially the packaging costs. It is extremely important to minimize the losses for a VCSEL interconnect system since the total optical power involved is very low.

There have been research activities in recent years on beam shaping of vertical-cavity lasers using microlenses. The structures are basically in two categories: (1) 980 nm substrate-emitting lasers with microlenses monolithically integrated on the GaAs substrate; and (2) Vertical-cavity lasers that are monolithically or externally integrated with diffractive optical elements (DOE) for output beam control.

As an example of the former, U.S. Pat. No. 5,073,041 entitled "Integrated Assembly Comprising Vertical Cavity Surface-Emitting Laser Array with Fresnel Microlenses" discloses beam shaping for a 980 nm VCSEL with a Fresnel microlens array on a GaAs substrate. The laser beam transmits through its GaAs substrate which has to be within a certain thickness in order to become transparent to the 980 nm beam. The required monolithic fabrication process is also very complicated with little flexibility.

Another example that is related to the background of the current invention, U.S. Pat. No. 6,583,445 entitled "Integrated Electronic-Optoelectronic Devices and Method of Making the Same", discloses an integrated electronic-optoelectric module comprising of VCSELs and photodetectors with ultrathin silicon-on-sapphire electronic circuitry composite substrate. Such modules will be useful for electro-optical interconnects for computing and switching systems.

In sum, the optical outputs of conventional optical transmitters exhibit a considerably large beam divergence. It is very difficult to integrate optical transmitters to the receiving detectors and optical fibers. External optical components can be employed to shape the beams, but they will cause significant optical aberrations and insertion losses, increase packaging costs, and ultimately reduce the power efficiency. Thus, an outstanding need remains for an improved technique to shape the output beam of a VCSEL to achieve specific optical functionalities. Such an approach should lead to optically controlled, low-loss, high-efficiency, and high bandwidth transmitters and interconnects.

SUMMARY OF THE INVENTION

This invention improves upon existing discrete and integrated vertical-cavity surface-emitting laser (VCSEL) fabrication techniques by providing an approach to hybridized structures including micro-optical elements (MOEs) monolithically incorporated into associated electronics for beam shaping to realize improved optical transmitters and interconnect configurations. Broadly, according to this invention, sub-micrometer-scale micro-optical elements (MOEs) are fabricated monolithically onto transparent driver substrates to achieve flexibility and simplicity in optical design, fabrication, and integration. In the preferred configurations, the VCSELs are hybridized onto MOE-bearing substrates using flip-chip bonding technique to form an integrated and optically controlled transmitter. The MOEs have optical functionalities of collimation or focusing according to specific application requirements.

The approach represents several points of novelty. One is the monolithic fabrication of sub-micron dimension micro-optical-elements (MOEs) onto optically transmissive driver substrates in general and onto CMOS-driver sapphire substrate in particular. Successful design and fabrication of such structures without interfering with the driver circuitry represents a unique approach to optical transmitter/interface design.

Another inventive aspect involves the procedure of making pseudo-monolithical optical-controlled VCSEL transmitters using a flip-chip hybridization technique. A further inventive aspect resides in self-aligned parallel optical interconnects based on the fabrication of pseudo-monolithic transmitters.

Overall, the approach facilitates a simplified system that eliminates bulky conventional optical components and minimizes or eliminates the insertion loss and optical aberrations in other similar optical systems, thereby dramatically increasing the overall efficiency of the interconnect system.

The invention finds utility in numerous areas, including free-space optical interconnects, optical fiber communications both in short-reach and long-haul ranges, and laser sensors. System-level applications include affordable high-bandwidth, high-efficiency multi-channel optical sensors and interconnects for data communications.

DETAILED DESCRIPTION OF THE INVENTION

According to this invention, micro-optical elements (MOEs) are designed and fabricated onto transparent laser driver substrates to collimate or focus the beams from vertical-cavity surface-emitting lasers (VCSELs) in accordance with specific application requirements. According to a method aspect of the invention, the VCSELs are hybridized onto the MOE-bearing substrates using flip-chip bonding technique to form integrated and optically controlled transmitters.

In the preferred embodiments, silicon-on-sapphire (SOS) substrates are used in conjunction with complimentary metal-oxide-semiconductor (CMOS) VCSEL driver circuits. The driver circuits are fabricated on the sapphire substrates without affecting the optical transmission coefficient. Specifically, the sapphire driver substrates include a layer of index-matching material, and the MOE structures with specific functionality are fabricated on this index matching material using lithography and chemical etching processes. This hybridization procedure bonds the VCSEL chip onto the MOE-bearing sapphire substrate to form both discrete and integrated optically controlled transmitters.

Figure 1:
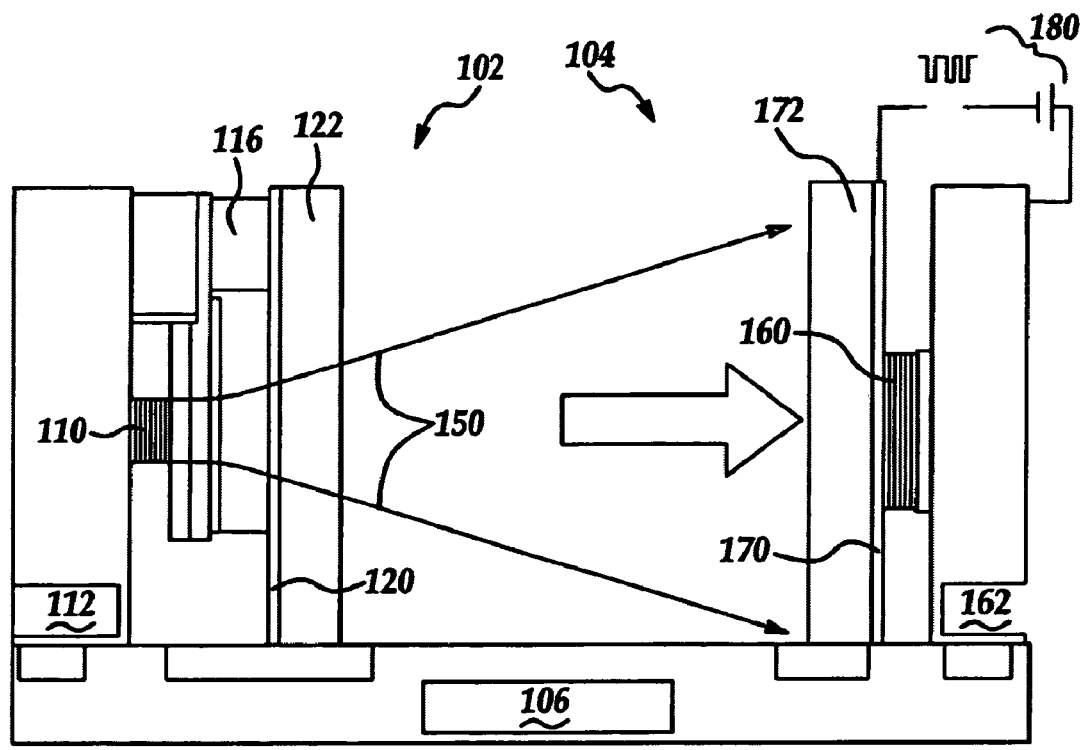
FIG. 1 is a side-view diagram of a free-space vertical-cavity surface-emitting laser (VCSEL) without beam control.

FIG. 1 is a diagram which shows a free-space VCSEL transmitter (102) and receiver (104) constructed in accordance with this invention. The transmitter 102 includes a VCSEL cavity 110 formed on a GaAs substrate 112, which, in turn, is mechanically mounted to achieve a lateral emission on sub-mount 106. The beam from the cavity 110 passes through a sapphire substrate 122, which includes silicon-on-sapphire (SOS) driver circuitry, interconnected to the laser portion of the transmitter through the Indium bump electrical contact 116.

On the receiving side, a photodetector active receiver cell 160 is sandwiched between a GaAs substrate 162 and a sapphire substrate 172, including SOS receiver circuits 170. Circuitry and waveforms 180 show the received signal being extracted following optical to electrical conversion.

FIG. 1 is a drawing which shows a divergent beam 150 lacking beam control, such that the area of the beam striking the substrate 172 is very large compared to the area of the receiver cell 160, thereby leading to marked system inefficiency. Although FIG. 1 shows the case of an interconnect without beam control, this diagram is not representative of the prior art, since other novel aspects according to the invention are disclosed. For example, optically transmissive substrate 122, preferably sapphire, includes driver circuitry 120 formed thereon, which does not interfere with beam 150. Additionally, the driver circuitry 120 is the Indium bump electrically interfaced to the laser itself through contact 116.

Figure 2:
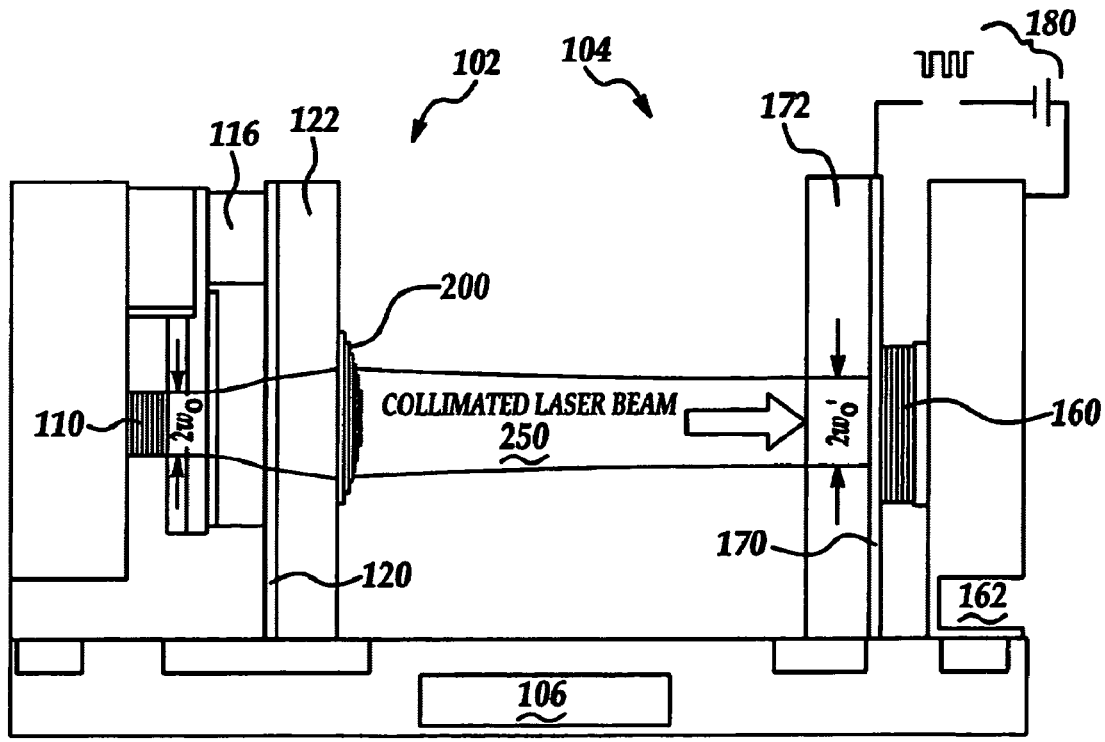
FIG. 2 is a side-view drawing of a hybridized VCSEL transmitter including a micro-optical element (MOE) facilitating collimation of the beam for greater compatibility with a receiver subsystem.

FIG. 2 is very similar to FIG. 1, and like numerals correspond to those described with respect to FIG. 1. The notable exception is that substrate 122 now includes a micro-optical element (MOE) 200, in this case structured to collimate the beam 250. As such, divergence is controlled, and the width of the beam from the emitter 110, namely, $2w_o$ is similar in area to the received beam width $2w_o'$ at receiver cell 160, resulting in a dramatic improvement in communication efficiency. MOE 200 is preferably an index-matched microoptical element in the form of PMMA (polymethyl methacrylate), photoresist, or other conventional optical materials.

Figure 3:
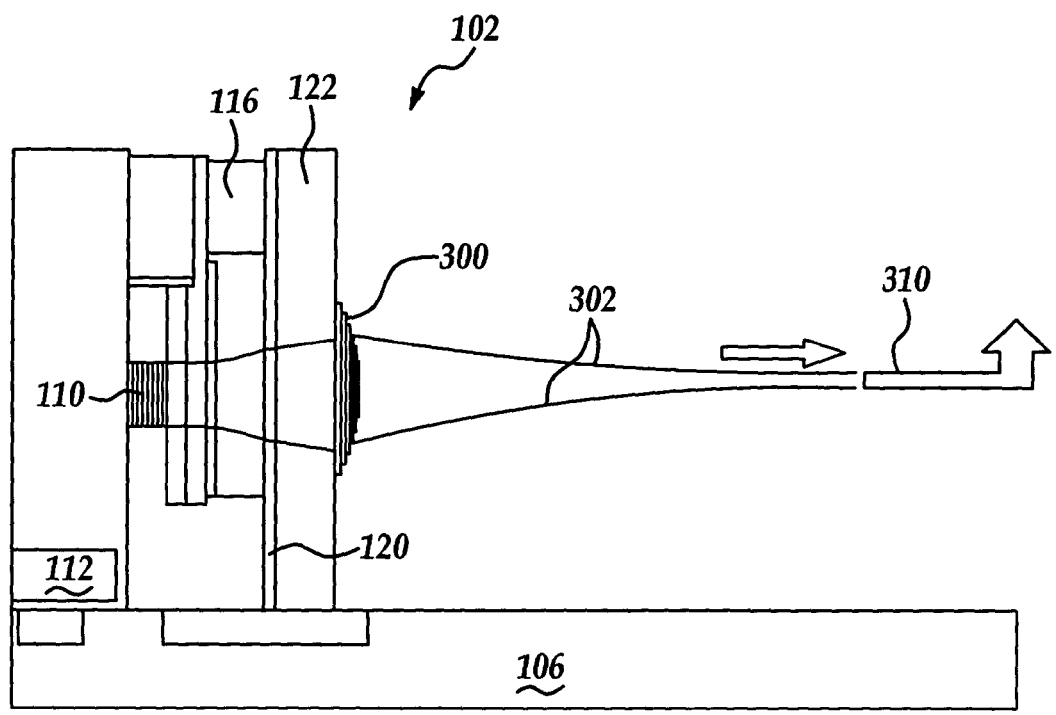
FIG. 3 is a side-view drawing of a hybridized VCSEL transmitter according to the invention, utilizing an MOE for optical focusing onto the end of an optical fiber.

FIG. 3 is also similar to FIG. 1, and like numerals correspond to those described with respect to FIG. 1. The notable exception is that the MOE 300 is constructed to focus the beam as opposed to mere collimation, resulting in delivery to a much smaller point, more conducive to collection and coupling at the end of an optical fiber 310.

Figure 4:
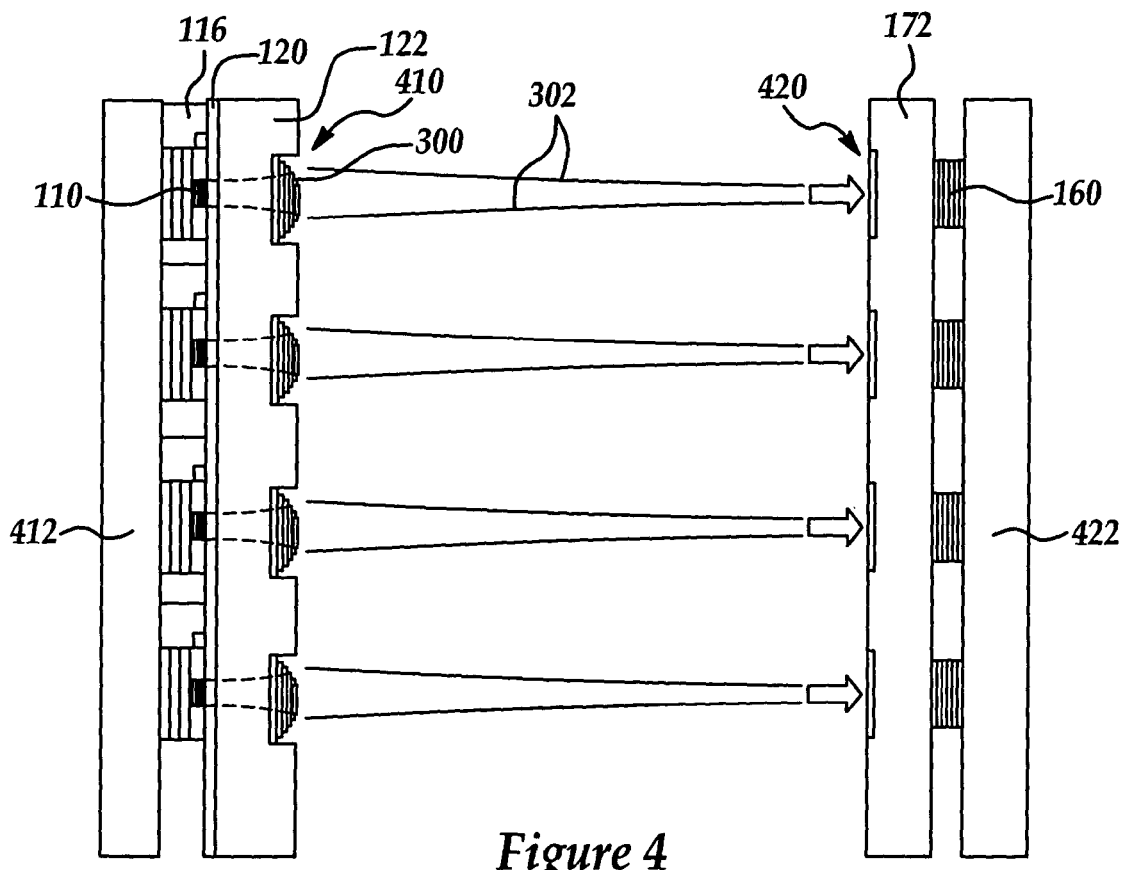
FIG. 4 is a drawing of a pseudo-monolithically integrated transmitter/receiver array constructed in accordance with the invention, facilitating a parallel optical interconnect arrangement.

Given the highly integrated nature of the component fabrication according to the invention, the technique may be extended to multiple transmitters and/or multiple receivers (or fibers), preferably in the form an array structure. FIG. 4, for example, is a simplified diagram of a pseudo-monolithically integrated parallel optical interconnect involving a linear or two-dimension VCSEL array 410 in optical communication with a photodetector array 420 active receiver cell as detailed with respect to the previous Figures. The emitters associated with the transmitter array may be mounted on a common substrate 412, and the receiver circuits likewise may be mounted on a common substrate 422.

Figure 5B:
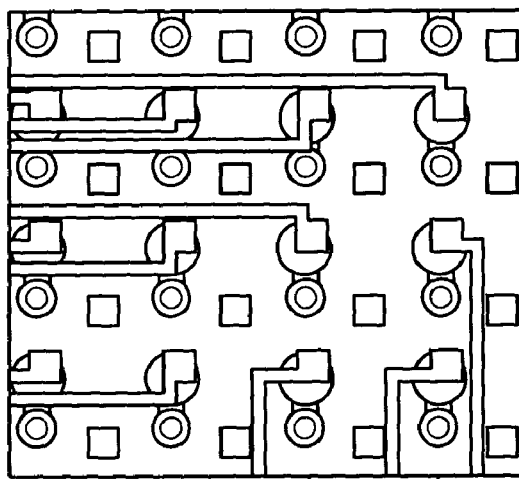
FIGS. 5A–5C illustrate a flip-chip bonded 850 nm VCSEL 8×8 array viewed through the sapphire substrate (SA); an enlarged section of the array illustrated in FIGS. 5A (5B), and a reversed view of a portion of the enlarged section of FIG. 5B that illustrates a hybridized opto-transmitter array with MOE optical-control patterns fabricated on a sapphire substrate.
Figure 5C:
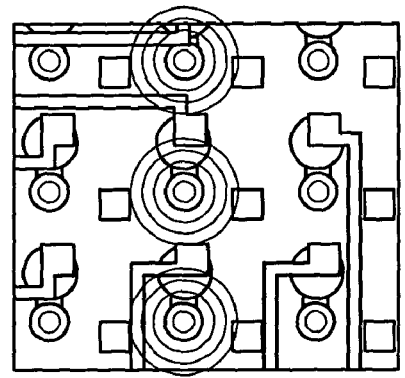
Figure 5A:
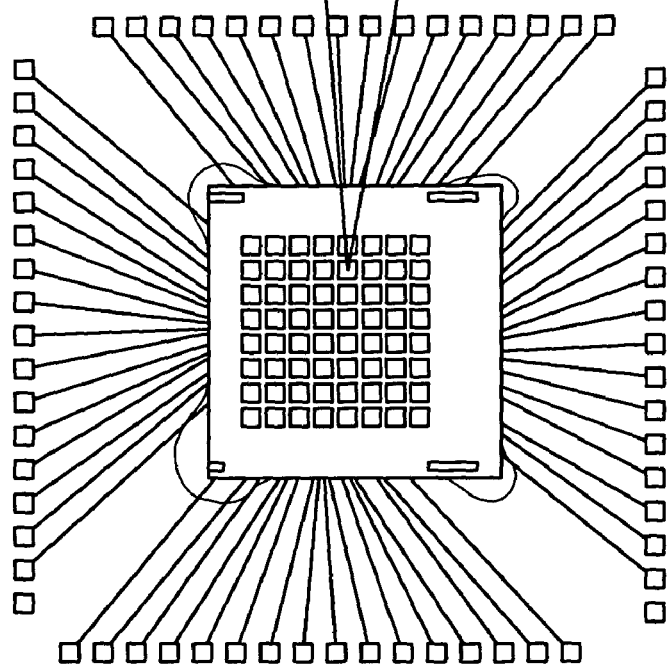

In terms of a specific example, an 850-nanometer top-emitting VCSEL 2-d array has been constructed onto a transparent sapphire driver substrate. (See J. J. Liu, B. Riely, P. H. Shen, N. Das, Peter Newman W. Chang, and G. J. Simonis, "*Ultra-Low Threshold Sapphire Substrate-Bonded Top-Emitting 850 nm VCSEL Array*", IEEE Photonics Technology Letters, September 2002, the entire content of which is incorporated herein by reference). The MOEs were hybridized with the VCESL array, yielding psuedo-monolithically integrated optical transmitters, as shown in FIG. 5. The optically controlled transmitters directly integrate into optoelectronic systems such as optical interconnects with high coupling efficiency.

The VCSEL structure in this example was grown on a n-type GaAs substrate using molecular beam epitaxy (MBE). The VCSEL epitaxial structure consists of a 35-pair n-doped $Al_{0.90}Ga_{0.10}As/Al_{0.16}Ga_{0.84}As$ bottom distributed Bragg reflector (DBR), a 1-micron cavity, and a 25-pair p-doped $Al_{0.9}Ga_{0.1}As/Al_{0.16}Ga_{0.84}As$ top DRB. The active region consists of three 70 Å quantum wells with 70 Å $Al_{0.30}Ga_{0.70}As$ layers as barriers. The heavy-hole exciton resonant energy of the quantum well was designed to be at 15 meV above the cavity resonant energy to account for the band gap narrowing at high carrier concentrations. This ensures a good match between the gain spectrum and the cavity characteristics. Testing structures for such a design were repeatedly grown and characterized by photoreflectance and photoluminescence spectrosopies until the precise growth condition and epitaxial structure were achieved.

The first two pairs of the DBRs (both the p-DBR and the n-DBR) close to the active region are lightly doped ($5 \times 10^{17} cm^{-3}$) to reduce the free carrier absorption. Two 300

Å-thick $Al_{0.98}Ga_{0.02}As$ layers for oxidation were embedded in the first period of the p- and n-DBRs and aligned with the node of the standing wave to reduce the scattering loss. The rest of the DBRs were modulation doped with maximum doping of $1\times10^{19}cm^{-3}$ (for P-type, beryllium) and $4\times10^{18}cm^{-3}$ (for n-type, Silicon) at the nodes and minimum of $1\times10^{18}cm^{-3}$ for both n-and p-type at the anti-nodes. Quadratic graded layers with thickness of 250 Å were inserted at the heterojunctions of the DBRs to reduce the series resistance. The grading layers consist of $Al_{0.16}Ga_{0.84}As/Al_{0.47}Ga_{0.53}As$ and $Al_{0.47}Ga_{0.53}As/AlAs$ short period superlattices. A 400 Å $Al_{0.16}Ga_{0.84}As$ layer followed by a 100 Å GaAs layer, both p-doped to $1\times10^{19}$ $cm^{-3}$, were deposited on the top of DBRs to achieve good ohmic contact.

The device processing starts with a ring contact Ti/Pt/Au metal deposition on the top DBR contact layer. A $BCl_3+Cl_2$ reactive ion etching (RIE) process produced 32-micron-diameter, 4-micron-tall, and 125-micron-pitch 8×8 VCSEL mesa arrays with the AlAs oxidation layers exposed. Wet oxidation was performed at 415° C. for 20 minutes by passing the carrier gas nitrogen through $H_2O$ at 85° C. The resultant mesas were passivated by low-temperature plasma enhanced chemical vapor deposition (PECVD) of 5000 Å $SiO_2$ layer. Spin-coated Cyclotene (BCB) resin was applied on the mesa structure for planarization.

For future flip-chip bonding of the device an interconnecting metal deposition process was used to form offset electrical contacts to the p-contacts of the mesas. Patterned Indium bumps were deposited by e-beam evaporation on top of the offset electrical contacts for flip-chip bonding. N-contact for the VCSEL was introduced on the backside of the GaAs substrate by depositing Ge/Ni/Au metal film. After these fabrication procedures, the 8×8 VCSEL arrays were diced out and prepared for hybridization with driver chips.

To host VCSEL arrays, the CMOS and fan-out circuitry formed on sapphire substrate also contained matching 8×8 array contact pads with 125-micron pitch. The contact pads on the fan-out circuitry were further deposited with Indium bumps to improve bonding yield efficiency and electrical conductivity. The flip-chip bonding process was performed using a commercial flip-chip bonder. A special device holder was fabricated for handling the 1-mm size VCSEL chips. An average bonding force of 8 grams per bump was carefully applied on VCSEL chips and sapphire substrates. This flip-chip bonding procedure was experimentally verified in a separate investigation using a daisy-chain structure. The results provided a nearly 100% yield of 128 continuous electrical contacts. The average contact resistance was measured below 0.1 Ohms per bump. After the hybridization, the device was mounted in a 68-pin pin-grid-array (PGA) package. An optical window was created on the bottom of the PGA package for transmission of the VCSEL array beams.

We claim:

1. A pseudo-monolithical optical transmitter, comprising:
   at least one semiconductor laser outputting a laser beam having a divergence angle;
   a layer of material substantially transparent to the beam, the layer being supported so that the beam penetrates through the material;
   at least one micro-optical element (MOE) formed on a first posterior side of the layer of material, the MOE being operative to reduce the divergence angle of the beam; and
   driver circuitry for the at least one laser formed on a second anterior side of the layer of material.

2. The optical transmitter of claim 1, wherein the layer of material is sapphire.

3. The optical transmitter of claim 1, wherein the MOE is operative to substantially collimate the laser beam.

4. The optical transmitter of claim 1, wherein the MOE is operative to focus the laser beam.

5. The optical transmitter of claim 1, further including:
   a flip-chip interconnection between the drive circuitry and the at least one laser.

6. The optical transmitter of claim 1, wherein the at least one laser is a vertical-cavity surface-emitting laser (VCSEL).

7. The optical transmitter of claim 1, wherein the at least one laser is a superlattice.

8. The optical transmitter of claim 1, wherein the at least one laser is a quantum well.

9. The optical transmitter of claim 1, wherein:
   the at least one laser is a vertical-cavity surface-emitting laser (VCSEL) formed on a substrate; and
   the substrate is edge-mounted to a mechanical sub-mount defining a plane such that the laser beam is substantially parallel to the plane of the sub-mount.

10. The optical transmitter of claim 1, wherein:
    the at least one laser is a vertical-cavity surface-emitting laser (VCSEL) formed on a first substrate edge-mounted to a mechanical sub-mount defining a plane such that the laser beam is substantially parallel to the plane of the sub-mount; and
    an optical receiver formed on a second substrate edge-mounted to the mechanical sub-mount such that the receiver is aligned with the laser beam.

11. The optical transmitter of claim 1, wherein:
    the at least one laser is a vertical-cavity surface-emitting laser (VCSEL) formed on a first substrate edge-mounted to a mechanical sub-mount defining a plane such that the laser beam is substantially parallel to the plane of the sub-mount;
    an optical receiver formed on a second substrate edge-mounted to the mechanical sub-mount such that the receiver is aligned with the laser beam; and
    a second substantially transparent layer of material containing electronic circuitry associated with operating the optical receiver.

12. The optical transmitter of claim 1, further including:
    an array of the semiconductor lasers, each outputting a laser beam having a divergence angle;
    a layer of optically transmissive material supported so that each beams penetrates through the material; and
    an array of micro-optical elements (MOEs) formed on a first posterior side of the layer of material, each MOE being operative to reduce the divergence angle of a respective one of the beams and;
    driver circuitry for each laser in the array formed on a second anterior side of the layer of material.

13. The optical transmitter of claim 1, further including:
    an array of the semiconductor lasers, each outputting a laser beam having a divergence angle;
    a layer of optically transmissive material supported so that each beam penetrates through the material;
    an array of micro-optical elements (MOEs) formed on a first posterior side of the layer of material, each MOE being operative to reduce the divergence angle of a respective one of the beams;
    driver circuitry for each laser in the array formed on a second anterior side of the layer of material; and
    an array of optical receivers, each configured to receive a respective one of the beams.

14. The optical transmitter of claim 1, wherein:
the laser is a vertical-cavity surface-emitting laser (VCSEL) formed on a first substrate edge-mounted to a mechanical sub-mount defining a plane such that the laser beam is substantially parallel to the plane of the sub-mount; and
an optical fiber having an end aligned to receive the beam and deliver it to a remote location.

15. An optical transmitter-receiver, comprising:
at least one semiconductor laser outputting a laser beam having a divergence angle;
a layer of material substantially transparent to the beam, the layer being supported so that the beam penetrates through the material;
at least one micro-optical element (MOE) formed on a first posterior side of the layer of material, the MOE being operative to reduce the divergence angle of the beam;
driver circuitry for the at least one laser formed on a second anterior side of the layer of material; and
an optical receiver operative convert the laser beam into a corresponding electrical signal.

16. The optical transmitter-receiver of claim 15, wherein the layer of material is sapphire.

17. The optical transmitter-receiver of claim 15, wherein the MOE is operative to substantially collimate the laser beam.

18. The transmitter-receiver of claim 15, further including:
a flip-chip interconnection between the driver circuitry and the at least one laser.

19. The transmitter-receiver of claim 15, wherein the at least one laser is a vertical-cavity surface-emitting laser (VCSEL).

20. The transmitter-receiver of claim 15, wherein:
the at least one laser is a vertical-cavity surface-emitting laser (VCSEL) formed on a substrate; and
the substrate is edge-mounted to a mechanical sub-mounted defining a plane such that the laser beam is substantially parallel to the plane of the sub-mount.

21. The transmitter-receiver of claim 15, wherein:
the at least one laser is a vertical-cavity surface-emitting laser (VCSEL) formed on a first substrate edge-mounted to a mechanical sub-mount defining a plane such that the laser beam is substantially parallel to the plane of the sub-mount; and
the optical receiver is formed on a second substrate edge-mounted to the mechanical sub-mount.

22. The transmitter-receiver of claim 15, wherein:
the at least one laser is a vertical-cavity surface-emitting laser (VCSEL) formed on a first substrate edge-mounted to a mechanical sub-mount defining a plane such that the laser beam is substantially parallel to the plane of the sub-mount;
the optical receiver is formed on a second substrate edge-mounted to the mechanical sub-mount; and
a second substantially transparent layer of material containing electronic circuitry associated with operating the optical receiver.

23. The transmitter-receiver of claim 15, further including:
an array of the semiconductor lasers, each outputting a laser beam having a divergence angle;
a layer of optically transmissive material supported so that each beam penetrates through the material;
an array of micro-optical elements (MOEs) formed on a first posterior side of the layer of material, each MOE being operative to reduce the divergence angle of a respective one of the beams;
driver circuitry for each laser in the array formed on a second anterior side of the layer of material; and
an array of optical receivers, each configured to convert a respective one of the laser beams into a corresponding electrical signal.

24. An optical transmitter-receiver, comprising:
a mechanical sub-mount;
a vertical-cavity surface-emitting laser (VCSEL) formed on a first substrate edge-mounted to the mechanical sub-mount and outputting a laser beam;
a first layer of optically transmissive material including a micro-optical element (MOE) operative to substantially collimate the beam on a first posterior side of the first layer and laser driver circuitry on a second anterior side of the first layer;
an optical receiver formed on a second substrate edge-mounted to the mechanical sub-mount such that the receiver is aligned to receive the collimated beam; and
a second layer of optically transmissive material including circuitry associated with the optical receiver.

25. The optical transmitter-receiver of claim 24, wherein the layers of material are sapphire.

26. An optical transmitter-receiver, comprising:
a semiconductor laser outputting a laser beam having a divergence angle;
a layer of material substantially transparent to the beam, the layer being supported so that the beam penetrates through the material;
a micro-optical element (MOE) formed on a first posterior side of the layer of material, the MOE being operative to focus the beam;
driver circuitry for the laser formed on a second anterior side of the layer of material; and
an optical fiber having an end aligned to receive the focused beam and deliver it to a remote location.

27. The optical transmitter-receiver of claim 26, wherein the laser is a vertical-cavity surface-emitting laser (VCSEL).

28. The optical transmitter-receiver of claim 26, wherein:
the laser is a vertical-cavity surface-emitting laser (VCSEL) formed on a substrate; and
the substrate is edge-mounted to a mechanical sub-mount defining a plane such that the laser beam is substantially parallel to the plane of the sub-mount.

* * * * *